(12) United States Patent
Kang et al.

(10) Patent No.: US 6,943,294 B2
(45) Date of Patent: Sep. 13, 2005

(54) INTEGRATING PASSIVE COMPONENTS ON SPACER IN STACKED DIES

(75) Inventors: Jung Kang, Chandler, AZ (US); Kaladhar Radhakrishnan, Chandler, AZ (US); Shamala A. Chikamenahalli, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/744,194

(22) Filed: Dec. 22, 2003

(65) Prior Publication Data

US 2005/0135041 A1   Jun. 23, 2005

(51) Int. Cl.$^7$ ............................................. H01L 23/02
(52) U.S. Cl. ...................... 174/52.4; 257/777
(58) Field of Search ....................... 174/52.4, 52.2; 257/777

(56) References Cited

U.S. PATENT DOCUMENTS 5,864,177 A * 1/1999 Sundstrom ................. 257/723
6,005,778 A * 12/1999 Spielberger et al. ........ 361/770

* cited by examiner

*Primary Examiner*—Hung V. Ngo
(74) *Attorney, Agent, or Firm*—Kathy J. Ortiz

(57) ABSTRACT

An embodiment of the present invention is a technique to integrate passive components in a die assembly. A capacitor, inductor, or resistor is integrated on a spacer between upper and lower dies in stacked dies. Conductors are attached to the capacitor, inductor or resistor to connect the capacitor, inductor, or resistor to at least one of the upper and lower dies.

21 Claims, 5 Drawing Sheets

INTEGRATING PASSIVE COMPONENTS ON SPACER IN STACKED DIES

BACKGROUND

1. Field of the Invention

Embodiments of the invention relate to the field of semiconductor, and more specifically, to device packaging.

2. Description of Related Art

As semiconductor technology advances for higher processor performance, the frequency of logic and memory devices increases for higher speed. The balance between speed performance and power consumption becomes a challenging design problem. In the power delivery loop, both for core and input/output (I/O) power, parasitic inductance and resistance associated with the die package and/or printed circuit board cause a drop in voltage available to the device, leading to performance decrease.

Existing techniques to reduce voltage drop in power delivery loop have a number of disadvantages. De-coupling capacitors are added to the package to store charges and deliver to the device when required. However, de-coupling capacitors on a chip-scale package (CSP) increases the package form factor which is undesirable for many applications such as cellular phones. The height of high value capacitors may be higher than the total height of a multi-die stacked CSP and therefore such capacitors may be not used. Inductors are used in the voltage regulator for power delivery and/or phase-locked loop (PLL), band gap filter, or other radio frequency (RF) components to increase power performance. Resistors are used to dampen the resonance which is generated from the package inductance and on-chip capacitance. Placing these components at the package increase package form factor and interconnect parasitic losses.

BRIEF DESCRIPTION OF THE DRAWINGS

The invention may best be understood by referring to the following description and accompanying drawings that are used to illustrate embodiments of the invention. In the drawings.

DESCRIPTION

An embodiment of the present invention is a technique to integrate passive components in a die assembly. A capacitor, inductor or resistor is integrated on a spacer between upper and lower dies in stacked dies. Conductors are attached to the capacitor, inductor or resistor to connect the capacitor, inductor or resistor to at least one of the upper and lower dies.

In the following description, numerous specific details are set forth. However, it is understood that embodiments of the invention may be practiced without these specific details. In other instances, well-known circuits, structures, and techniques have not been shown in order not to obscure the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, a method of manufacturing or fabrication, etc.

Figure 1:
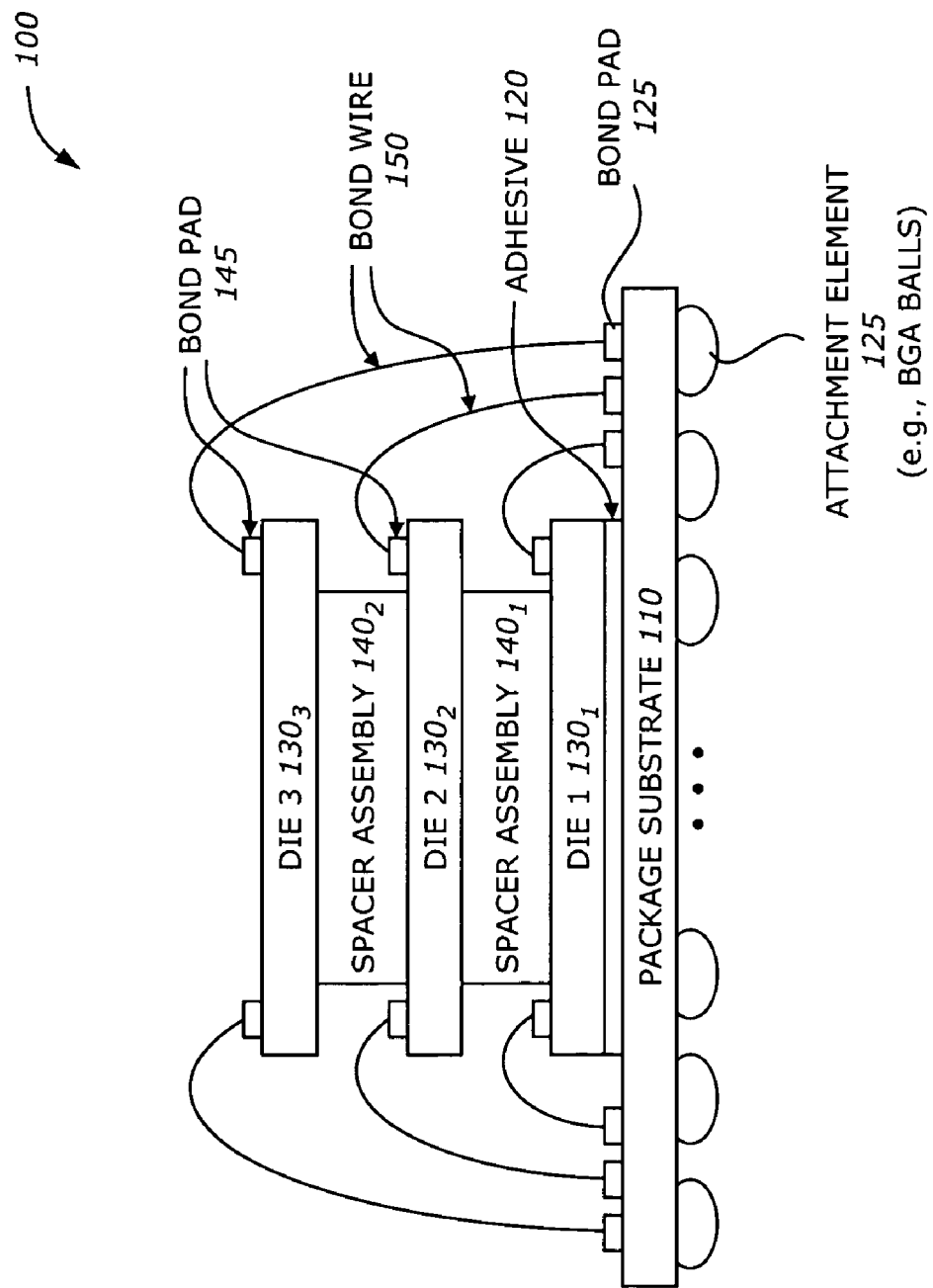
FIG. 1 is a diagram illustrating a die assembly in which one embodiment of the invention can be practiced.

FIG. 1 is a diagram illustrating a die assembly 100 in which one embodiment of the invention can be practiced. The die assembly 100 includes a package substrate 110, a plurality of attachment elements 115, a substrate adhesive layer 120, substrate bond pads 125, dies $130_1$ to $130_3$, spacer assemblies $140_1$ and $140_2$, die bond pads 145 and bond wires 150.

The package substrate 110 is any suitable substrate made of material such as silicon, ceramic, epoxy, and Bismaleimide Triazine (BT). The substrate 110 may also be a printed circuit board (PCB). The substrate 110 has a number of bond pads 125 to provide interconnections to the dies. The plurality of dies $130_1$ to $130_N$ form a stack and include dies stacked on top of one another. For illustrative purposes, three stacked dies $130_1$, $130_2$, and $130_3$ are shown. Each die is an integrated circuit (IC) or a chip. The number of dies in the stack may be any suitable number, odd or even, depending on the desired height. For example, the number of dies may be 4, 5, 6, or 10. The attachment elements 115 are interconnecting elements that attach the die assembly 100 to other packaging element such as a PCB, another package substrate, etc. In one embodiment, the attachment elements are Ball Grid Array (BGA) balls.

Each of the dies has a number of bond pads 145 to provide contacts for interconnections. The number of bond pads on each die may vary. When the bond pads are not suitably placed, a redistribution layer (not shown) may be formed to redistribute the interconnection pattern. The bond wires 150 connect the bond pads 140 from the dies to the bond pads 125 on the substrate 110.

The spacer assemblies $140_1$ to $140_K$ are used to separate the stacked dies and include passive components such as capacitor, inductor and resistor to provide a number of functions such as de-coupling, filtering, dampening resonance and/or voltage regulation. For illustrative purposes, two spacer assemblies $140_1$ and $140_2$ are shown. A spacer assembly is placed between two stacked dies and forms a group. In each group, there are a lower die and an upper die according to the position of the die with respect to the spacer assembly. A die may be referred to as an upper die for one group and a lower die for the next group. For example, the spacer assembly $140_1$ is placed between dies $130_1$ and $130_2$. The die is referred to as the lower die and the die is referred to as the upper die. The spacer assembly $140_2$ is placed between the dies $130_2$ and $130_3$. In this group, the die $130_2$ is referred to as the lower die and the die $130_3$ is referred to as the upper die.

Figure 2:
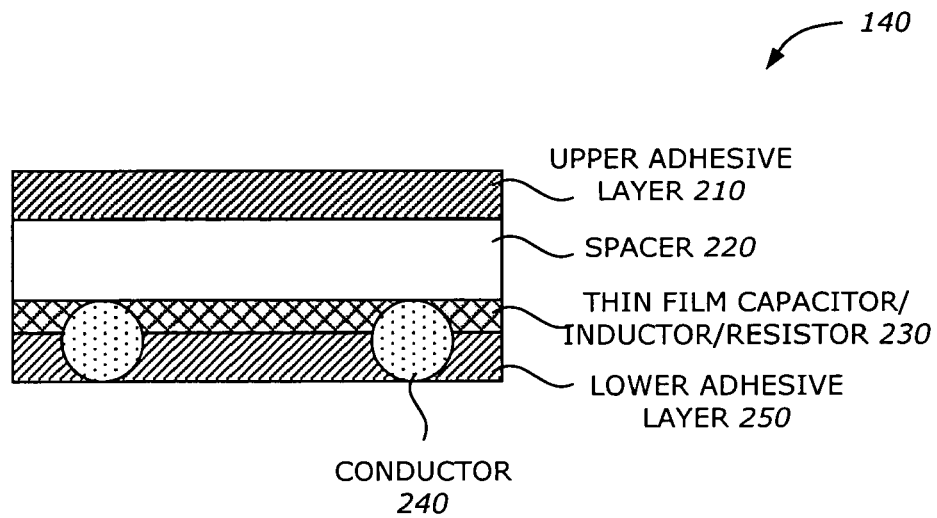
FIG. 2 is a diagram illustrating a spacer assembly according to one embodiment of the invention.

FIG. 2 is a diagram illustrating a spacer assembly 140 according to one embodiment of the invention. The spacer assembly 140 represents any one of the K spacer assemblies $140_1$ to $140_K$ in the die assembly shown in FIG. 1. The spacer assembly 140 includes an upper adhesive layer 210, a spacer 220, a thin-film capacitor, inductor, or resistor 230, a conductor 240, and a lower adhesive layer 250.

The upper adhesive layer 210 is a layer filled with adhesive material that is electrically and thermally conductive. It is used to attach the spacer 220 to the upper die (e.g., die 130₃ shown in FIG. 1), The spacer 220 is an element that is used to elevate same or similar sized die that are stacked one above another so that the bond pads on the die below are not covered up. It provides clearance for the bond wires 150 shown in FIG. 1. The spacer 220 may be made of various materials including silicon, polymer films, or polymer pastes with filter particles.

The thin-film capacitor, inductor or resistor 230 is fabricated on a spacer to provide various de-coupling, filtering, resonance dampening, and voltage regulation functions. The capacitor, inductor and resistor may also be fabricated in any combination together on the same spacer. A thin-film capacitor is useful for de-coupling and other filtering functions. The capacitor integrated with the spacer 220 offers higher performance than the capacitor on the package external to the die assembly because the impedance between the thin film capacitor and the die is extremely small. A thin-film inductor integrated with the spacer 220 is useful for radio frequency (RF) applications (e.g., wireless communication) and power delivery applications. A thin-film resistor integrated with the spacer 220 is useful to reduce the resonance from the package inductance and on-die capacitance. The typical range of the resistor is 0.2 Ω to 2 Ω, depending on the application.

The conductor 240 provides conductivity between the capacitor/inductor/resistor 230 and the lower die. The conductor 240 may be any conductivity path such as traces, wires, etc. In one embodiment, the conductor 240 includes a plurality of bumps attached to the thin-film capacitor/inductor/resistor 230 and the lower die.

The lower adhesive layer 250 is a layer filled with adhesive material. It is used to attach the spacer 220 and the thin-film capacitor/inductor 230 to the lower die (e.g., die 130₂ shown in FIG. 1).

The thin-film capacitor/inductor/resistor 230 may be fabricated in any suitable method to achieve high performance and reliability. For example, the capacitor may be fabricated in a parallel plate structure with high quality factor (Q) and high breakdown voltage (e.g., at least 50 Volts).

The integration of the thin-film capacitor/inductor/resistor 230 to the spacer 220 offers a number of advantages. First, the integrated thin-film capacitor eliminates the need for de-coupling capacitor on the package, external to the die assembly. This helps reduce the package form factor. Although the total height of the multi-die stacked CSP with spacer may increase slightly due to the conductor 240, this increase in height is not significant because the thickness of the thin film is very small, in the order of a few hundred angstroms. Second, the integrated thin-film capacitor has much lower impedance than the capacitor on the package. Third, due to the integration, the overall packaging cost is lower. Fourth, the integrated thin-film inductor provides robust voltage regulation in response to fast transients when used in a power delivery loop. The quality of power delivery is high because there is little interconnect parasitic losses. Fifth, the integrated thin-film inductor provides small form factor and high degree of integration in radio frequency (RF) or Phase-Locked Loop (PLL) filtering applications. Resonance is an important issue in the core and input/output (I/O) power delivery. The integrated thin-film resistor reduces resonance noise by dampening the resonance.

Figure 3:
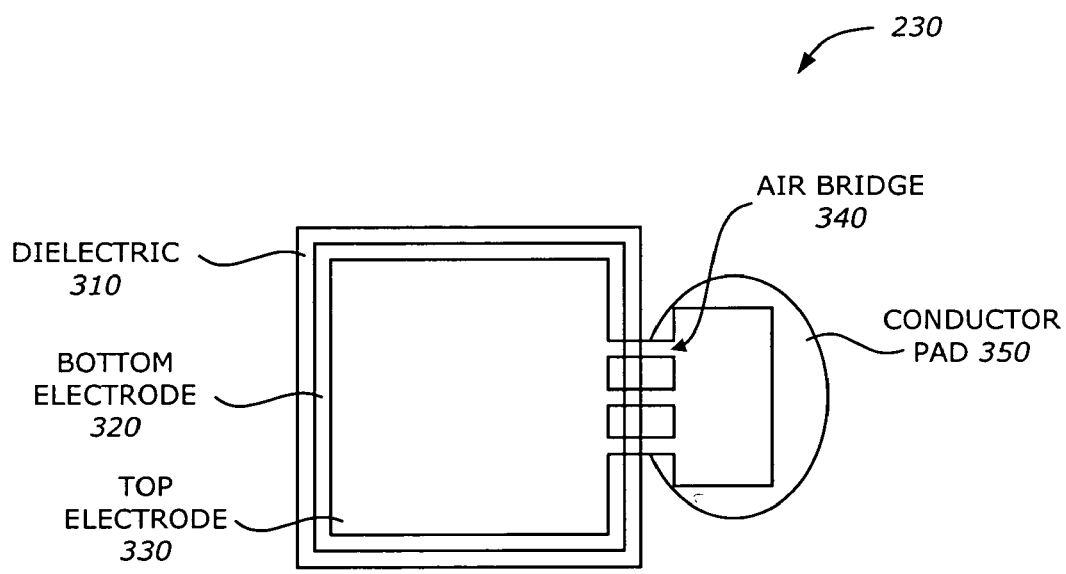
FIG. 3 is a diagram illustrating a layout of a thin-film capacitor according to one embodiment of the invention.

FIG. 3 is a diagram illustrating a layout of a thin-film capacitor 230 according to one embodiment of the invention. The thin-film capacitor 230 includes a dielectric 310, a bottom electrode 320, a top electrode 330, air bridges 340 and conductor pad 350. Note that this layout is merely an example. As is known by one skilled in the art, any other layout or design method applicable for thin-film or ultra thin-film and on-chip capacitor may be employed.

The dielectric 310 is any dielectric material that has low loss tangent at high frequency (e.g., above 1 GHz). Examples of suitable dielectric materials include silicon-nitride and polyimide. The thickness of the dielectric 310 is typically much less than the thickness of the associated spacer in the same spacer assembly. In one embodiment, the thickness of the dielectric 310 is between 50 angstrom and 200 angstrom.

The bottom and top electrodes 320 and 330 may be any conductor of comparable size with the dielectric 310. The air bridge 340 may be used to connect the top electrode 330 to a pad that falls within the conductor pad 350. The conductor pad 350 is a connection point for attachment with the conductor 240 (shown in FIG. 2).

The thin-film capacitor 230, when fabricated alone, is typically of similar size as the associated spacer in the same spacer assembly. The capacitance of the capacitor 230 may be at least 100 nF. As an example, assuming the spacer size is 5 mm×5 mm, and the dielectric 310 is silicon nitride with a thickness of 100 angstrom, the resulting capacitance is approximately 160 nF.

Figure 4:
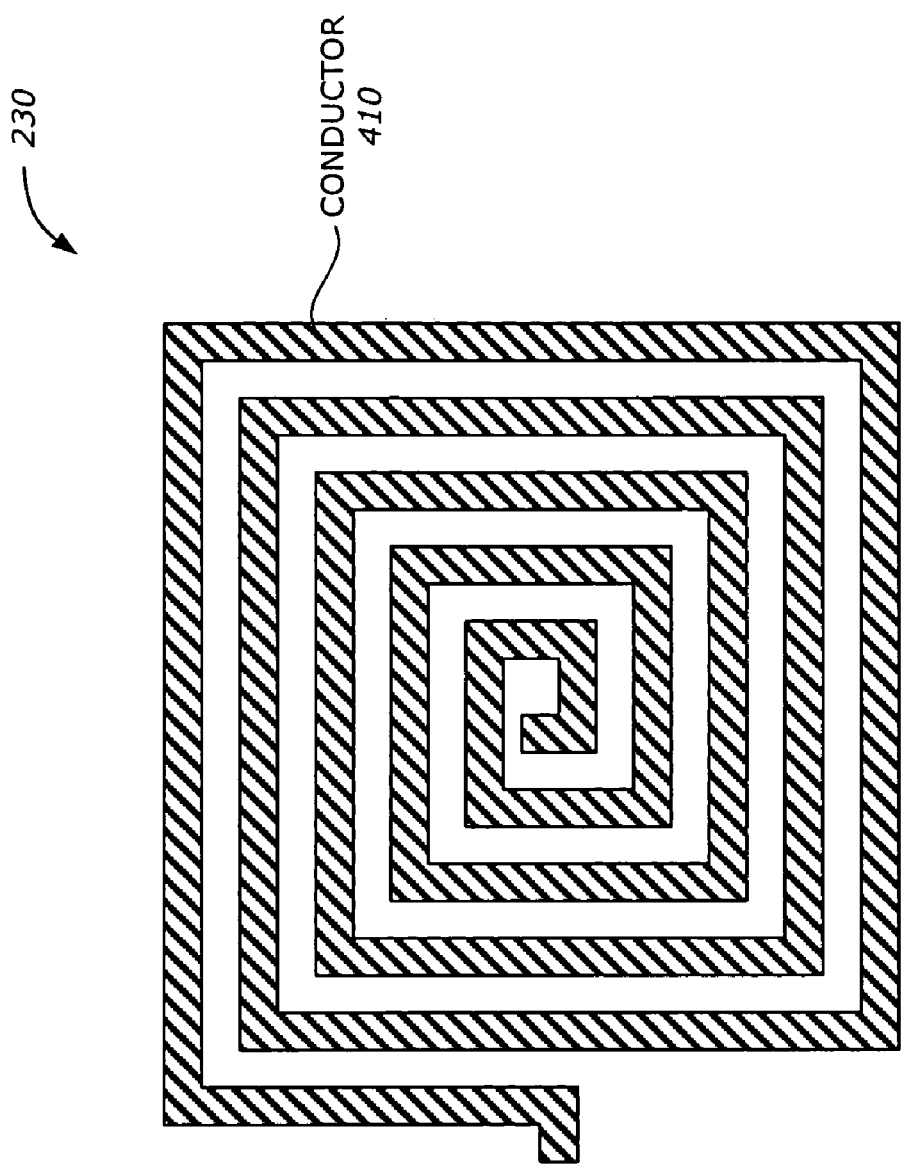
FIG. 4 is a diagram illustrating a layout of a thin-film inductor according to one embodiment of the invention.

FIG. 4 is a diagram illustrating a layout of a thin-film inductor 230 according to one embodiment of the invention. The thin-film inductor 230 includes a conductor 410. Note that this layout is merely an example. As is known by one skilled in the art, any other layout or design method applicable for thin-film or ultra thin-film and on-chip inductor may be employed.

The conductor 410 has a multi-turn geometry. The typical geometry is rectangle spiral geometry. Assuming a silicon inductor area of 300 μm×300 μm with about 3–16 turns, the resulting inductance may be in the range of 3 nH to 10 nH without using any magnetic material. The quality factor (Q) may be in the range of 10 to 20 with resonant frequencies in the range of 5–10 GHz with wafer level processing.

The conductor 410 may be constructed by having multiple layers, or by having multiple spiral patterns connected in series. In addition, the spiral pattern may be rectangular as shown in FIG. 4, or circular.

Figure 6:
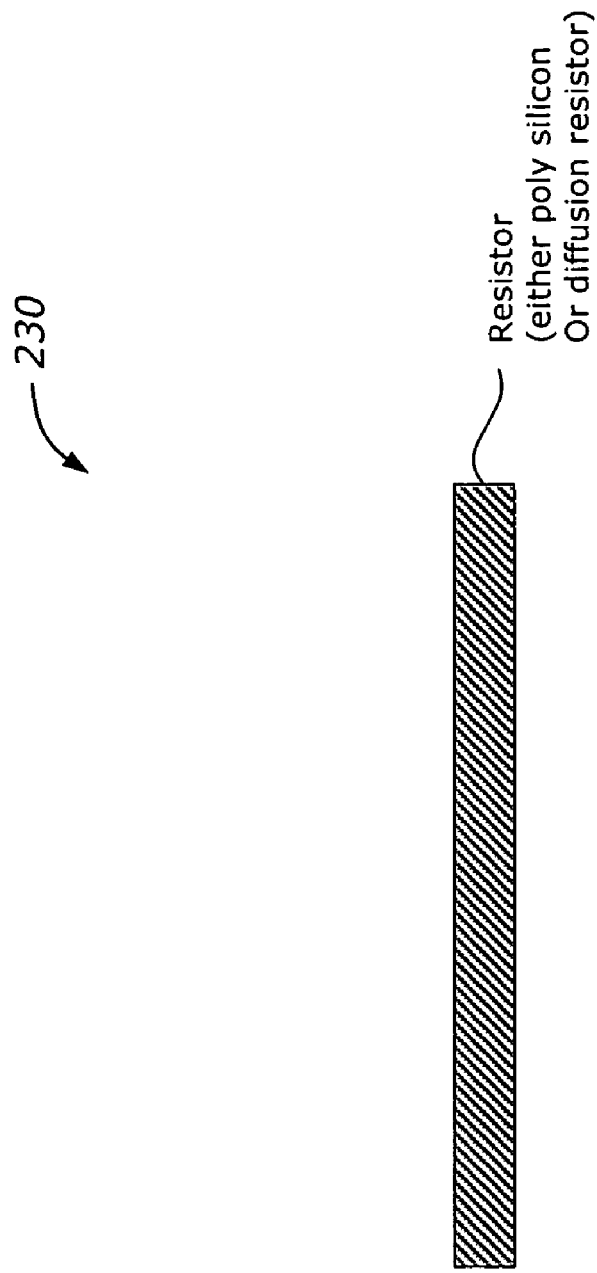
FIG. 6 is a diagram illustrating a layout of a thin-film resistor according to one embodiment of the invention.

FIG. 6 is a diagram of a layout of a thin film resistor 230, according to an embodiment of the invention. The thin film resistor 230 may comprise a polysilicon or a diffusion resistor, as are known in the art. Note that the geometry or shape of the resistor is merely an example. As is known by one skilled in the art, any other shape or design method applicable for thin-film or ultra thin-film resistors may be employed.

Figure 5:
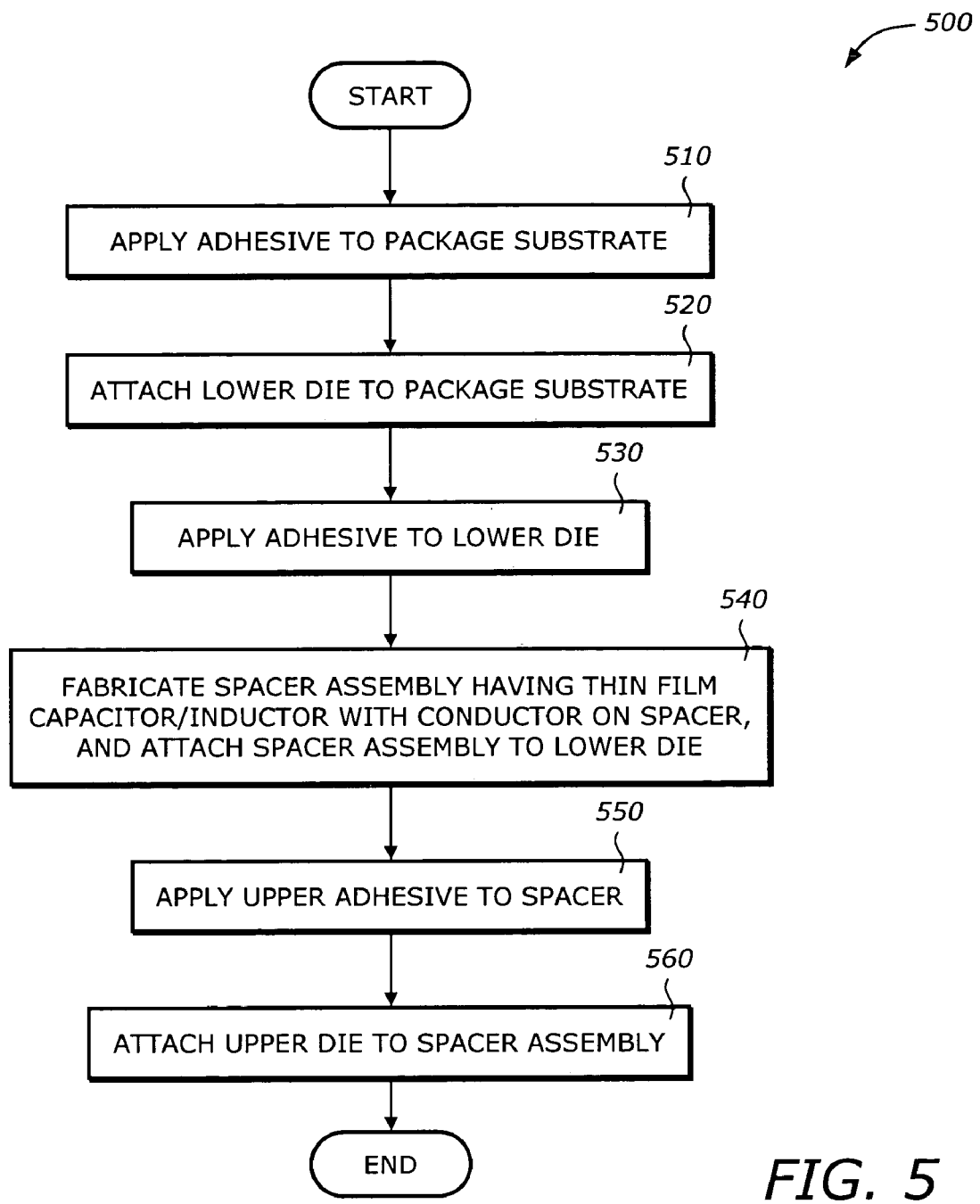
FIG. 5 is a flowchart illustrating a process to integrate thin-film passive component to die assembly according to one embodiment of the invention.

FIG. 5 is a flowchart illustrating a process 500 to integrate thin-film passive component to die assembly according to one embodiment of the invention.

Upon START, the process 500 applies adhesive to the package substrate (Block 510). Then, the process 500 attaches the lower die to the package substrate (Block 520). Next, the process 500 applies adhesive to the lower die (Block 530). Then, the process 500 fabricates a spacer assembly having thin-film capacitor/inductor/resistor and attaches the spacer assembly to the lower die (Block 540). The space assembly may be fabricated in a separate process and include conductors such as bumps.

Next, the process 500 applies upper adhesive to the spacer assembly (Block 550). Then, the process 500 attaches the upper die to the spacer assembly (Block 560) and is then terminated. Note that the process 500 may repeat to add more stacked dies if necessary.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   integrating a capacitor on a spacer between upper and lower dies in stacked dies; and
   attaching bumps to electrically connect the capacitor to at least one of the upper and lower dies.

2. The method of claim 1 further comprising:
   filling adhesive between the spacer and the upper die and between the spacer and the lower die.

3. The method of claim 1 wherein integrating comprises:
   integrating the capacitor being a thin-film capacitor having a dielectric material.

4. The method of claim 1 wherein integrating comprises:
   integrating the capacitor having a thickness substantially less than thickness of the spacer.

5. The method of claim 4 wherein integrating comprises:
   integrating the capacitor having the thickness between 50 angstrom to 200 angstrom.

6. The method of claim 1 wherein integrating comprises:
   integrating the capacitor having a capacitance of at least 100 nF.

7. The method of claim 1 further comprising:
   filling adhesive between the lower die to a package substrate.

8. A spacer assembly comprising:
   a capacitor integrated on a spacer between upper and lower dies in stacked dies; and
   bumps attached to the capacitor to electrically connect the capacitor to at least one of the upper and lower dies.

9. The spacer assembly of claim 8 further comprising:
   adhesive layers filled between the spacer and the upper die and between the spacer and the lower die.

10. The spacer assembly of claim 8 wherein the capacitor is a thin-film capacitor having a dielectric material.

11. The spacer assembly of claim 8 wherein the capacitor has a thickness substantially less than thickness of the spacer.

12. The spacer assembly of claim 11 wherein the capacitor has the thickness between 50 angstrom to 200 angstrom.

13. The spacer assembly of claim 8 wherein the capacitor has a capacitance of at least 100 nF.

14. The spacer assembly of claim 8 wherein the lower die is attached to a package substrate by an adhesive between the lower die and the package substrate.

15. A die assembly comprising:
   a package substrate;
   a plurality of stacked dies on the package substrate and having at least an upper die and a lower die; and
   at least a spacer assembly between the upper and lower dies, the spacer assembly comprising:
      a capacitor integrated on a spacer between the upper and lower dies, and
      conductors attached to the capacitor to electrically connect the capacitor to at least one of the upper and lower dies bumps attached to the capacitor to electrically connect the capacitor to at least one of the upper and lower dies.

16. The die assembly of claim 15 wherein the spacer assembly further comprises:
   adhesive layers filled between the spacer and the upper die and between the spacer and the lower die.

17. The die assembly of claim 15 wherein the capacitor is a thin-film capacitor having a dielectric material.

18. The die assembly of claim 15 wherein the capacitor has a thickness substantially less than thickness of the spacer.

19. The die assembly of claim 18 wherein the capacitor has the thickness between 50 angstrom to 200 angstrom.

20. The die assembly of claim 15 wherein the capacitor has a capacitance of at least 100 nF.

21. The die assembly of claim 15 wherein the lower die is attached to the package substrate by an adhesive between the lower die and the package substrate.

* * * * *